United States Patent
Henkel et al.

(10) Patent No.: US 8,981,782 B2
(45) Date of Patent: Mar. 17, 2015

(54) METHOD AND APPARATUS FOR MONITORING THE MAXIMUM AVAILABLE CAPACITY OF A BATTERY

(75) Inventors: Hartmut Henkel, Blomberg (DE);
Andreas Neuendorf, Steinheim (DE);
Michael Heinemann, Lage (DE); Mike Wattenberg, Leopoldshoehe (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 793 days.

(21) Appl. No.: 13/272,281

(22) Filed: Oct. 13, 2011

(65) Prior Publication Data

US 2012/0120983 A1      May 17, 2012

(30) Foreign Application Priority Data

Oct. 13, 2010   (DE) .......................... 10 2010 048 187

(51) Int. Cl.
*G01N 27/416* (2006.01)
*G01R 31/36* (2006.01)
*G01R 19/165* (2006.01)

(52) U.S. Cl.
CPC ...... *G01R 31/3679* (2013.01); *G01R 19/16542* (2013.01)
USPC .......................................... 324/431; 324/427

(58) Field of Classification Search
USPC ....................................................... 324/431
See application file for complete search history.

(56) References Cited

U.S. PATENT DOCUMENTS

2010/0256935 A1   10/2010   Imanishi et al.

FOREIGN PATENT DOCUMENTS

| DE | 3832839 | A1 | 3/1990 |
|----|---------|----|----|
| DE | 4007883 | A1 | 9/1991 |
| DE | 19952693 | A1 | 5/2001 |
| DE | 102007029156 | A1 | 1/2009 |
| JP | 1186912 | A | 3/1999 |
| JP | 2003161768 | A | 6/2003 |
| JP | 2006046919 | A | 2/2006 |
| JP | 2006068912 | A | 3/2006 |
| JP | 2006284472 | A | 10/2006 |
| JP | 2007087873 | A | 4/2007 |
| JP | 2008039526 | A | 2/2008 |
| JP | 2009128250 | A | 6/2009 |
| JP | 2009201327 | A | 9/2009 |

*Primary Examiner* — Edward Tso
*Assistant Examiner* — Robert Grant
(74) *Attorney, Agent, or Firm* — Leydig, Voit & Mayer, Ltd.

(57) ABSTRACT

A method of monitoring a maximum available capacity of a battery includes providing a number of diverse end-of-discharge-voltage values. A counter is assigned to each of the end-of-discharge-voltage values. The battery is discharged. One of the end-of-discharge-voltage values at which the battery is discharged is determined. A counter reading of the counter assigned to the determined end-of-discharge-voltage value is incremented. The previous steps are repeated. The counter readings are read-off so as to obtain a number of read-off counter readings. Based on the read-off counter readings, a first factor representing a first measure of a decline in the maximum available battery capacity is determined.

14 Claims, 3 Drawing Sheets

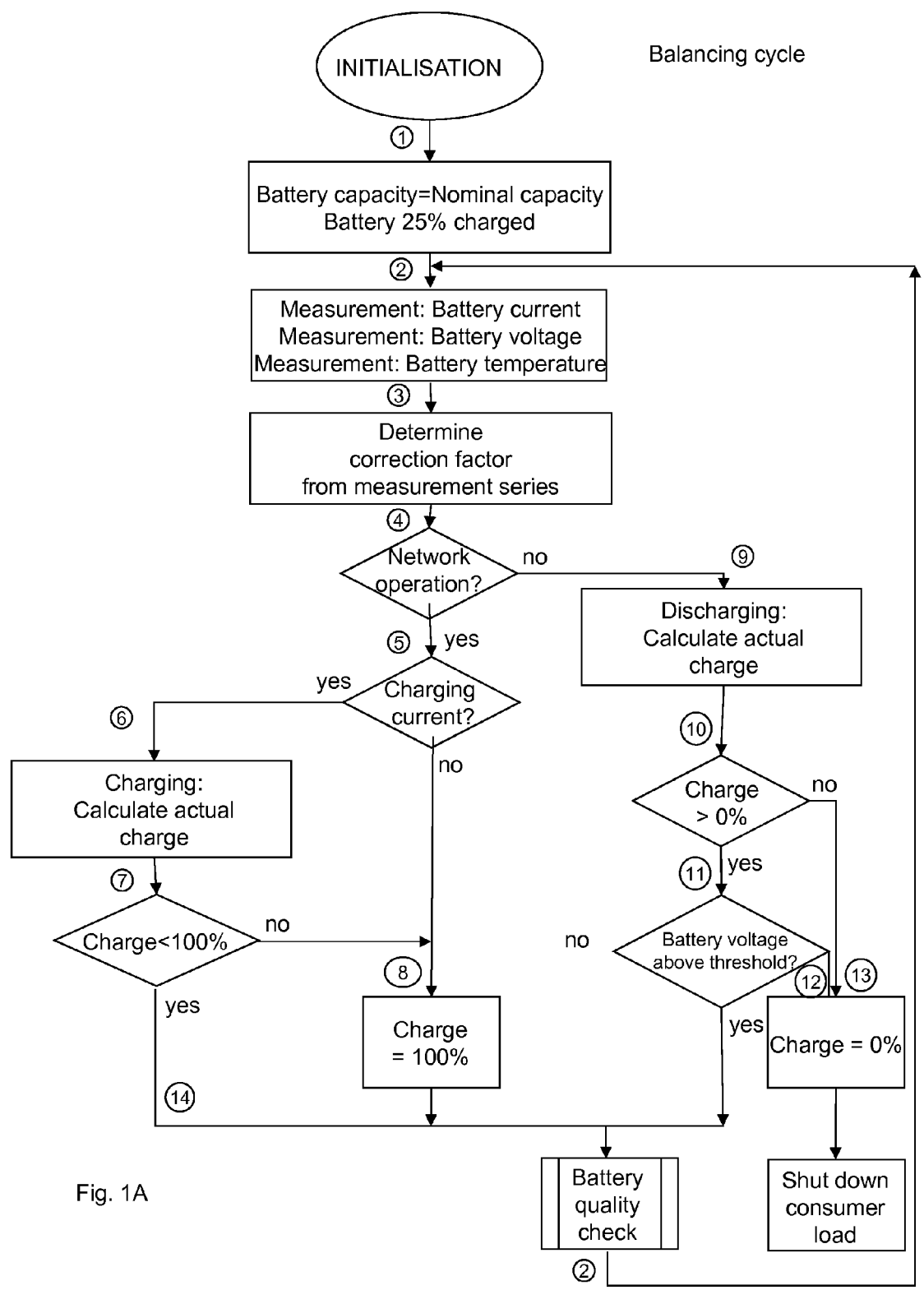

METHOD AND APPARATUS FOR MONITORING THE MAXIMUM AVAILABLE CAPACITY OF A BATTERY

CROSS REFERENCE TO PRIOR APPLICATIONS

Priority is claimed to German Application No. DE 10 2010 048 187.4, filed on Oct. 13, 2010, the entire disclosure of which is incorporated by reference herein.

FIELD

The invention relates to a method and an apparatus for monitoring the maximum available capacity of a battery and to an uninterruptible power supply, which is equipped with an apparatus for monitoring the maximum available capacity of a battery.

BACKGROUND

In order to provide an uninterrupted power supply, operation by means of batteries, in particular rechargeable batteries, is provided besides mains operation, in case of breakdown. For being able to provide a reliable electric power supply in industrial plants, motor vehicles, and many other fields, it is necessary to monitor the state of health (SOH) of the battery, the currently available or actual battery capacity, the charge status of the battery and numerous other battery parameters. Numerous solution options are already known in this regard.

For example, DE 199 52 693 A1 describes an apparatus for the determination and display of the state of health of a battery. In particular, the charge status of a battery can be determined with the known apparatus. To this end, the apparatus is equipped with sensors for ascertaining the battery voltage, battery temperature and battery current (charging current or discharging current). The known apparatus is further equipped with an analysis circuit, which can determine the battery SOH from the measured values. The known apparatus is furthermore capable of determining a charging and/or discharging balance of the battery for determination of the energy flow as a function of the discharge depth. In this connection, the battery temperature is one of the factors considered.

In addition, a method of monitoring rechargeable batteries is described in DE 38 32 839 C2. The method serves inter alia for calculation of the capacity that can be withdrawn from a battery for various discharging currents in relationship to the associated values of the discharge characteristic. In this manner, the point when the extractable capacity for an intended discharging current falls below a permissible minimum value can be established. This method takes account of the 'Peukert effect', which states that, as the discharging current of a battery increases, the energy that can be withdrawn steadily decreases.

A method for determining the status of a battery is described in DE 40 07 883 A1 with which method a respective discharge voltage value measured after current extraction from the battery is compared with a voltage value which is determined from a series of charge status curves, and the voltage difference of the two values is determined. This voltage difference is compared with the stored characteristics of the particular battery type and the decrease of the maximum available battery capacity is hence determined.

A monitoring and controlling system for several batteries connected in series is described in DE 10 2007 029 156 A1, the batteries potentials thereof being tapped and evaluated in order to optimize the service life or duration of batteries in hybrid vehicles.

SUMMARY

The present invention provides a method of monitoring a maximum available capacity of a battery. The method includes:
a) providing a plurality of diverse end-of-discharge-voltage values;
b) assigning a counter to each of the plurality of diverse end-of-discharge-voltage values;
c) discharging the battery;
d) determining one of the plurality of end-of-discharge-voltage values at which the battery is discharged;
e) incrementing a counter reading of the counter assigned to the determined end-of-discharge-voltage value;
f) repeating steps c-e;
g) reading-off the counter readings so as to obtain a plurality of read-off counter readings; and
h) determining, based on the plurality of read-off counter readings, a first factor representing a first measure of a decline in the maximum available battery capacity.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIGS. 1A and 1B shows a flowchart illustrating the charge balancing and determination of the battery quality;

DETAILED DESCRIPTION

Figure 1B:
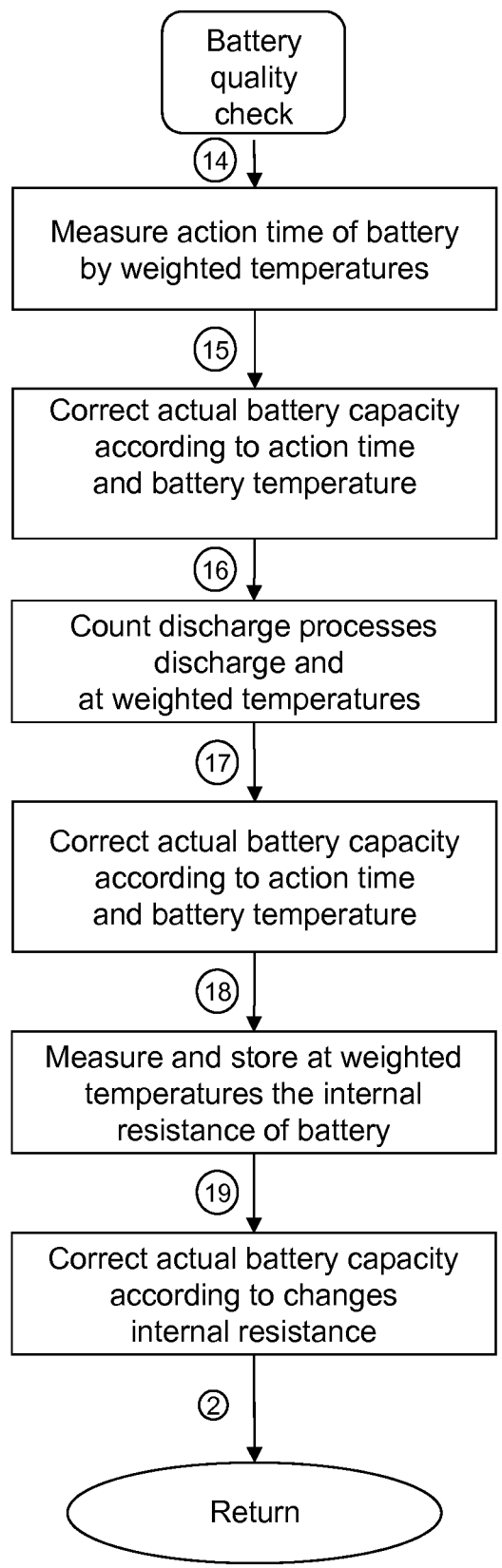

In an embodiment, the present invention provides a method and an apparatus with which the currently determined or actual charge status of a battery can be more accurately determined in order that, by this method, precise predictions as to the anticipated remaining operating time of the battery can be provided.

An embodiment of the invention provides a method by which the currently determined or actual battery quality can be checked at predetermined time points. The battery-quality value provides information as to the size of the maximum available battery capacity in relationship to the nominal capacity. The term nominal capacity refers to the maximum electrical charge that can theoretically be stored in the battery. Conversely, the term maximum available capacity refers to the quantity of charge that represents the maximum that can actually be withdrawn from the battery. The maximum available battery capacity depends on numerous factors, such as the battery temperature, the service life or duration and the internal resistance of the battery.

In an embodiment, the present invention can preferably be used in industrial systems in which UPS (Uninterruptible Power Supply) devices are employed. UPS devices serve, in the event of a power failure, to enable parts of the system and the control thereof to continue to operate for a certain period and then to be closed down in a defined manner. A precise knowledge of the currently measured or actual battery operating time is necessary because, if calculation of the battery operating time is defective, the battery voltage of the UPS can fail before the consumer unit has been shut down.

Accordingly, it is advantageous to know the actual charge status and the actual power consumption during battery operation in order to make accurate predictions as to the anticipated remaining battery operating time. A prediction of this kind enables the continued operation of the system, by means of the UPS devices used, for a specific period following a power failure, which may in fact correspond with the maximum operating time, in order that sufficient battery power is still available to enable the consumer units to be safely closed down. The actual charge status can be determined by means of a charging and discharging balance.

Since, in order to obtain a precise charge balance, the actual capacity of the battery, i.e. the maximum available capacity, needs to be accurately known, a method of monitoring the maximum available capacity of a battery is made available according to the invention.

According to an embodiment of the invention, a plurality of diverse values are provided for the end-of-discharge voltage at the end of each current extraction, to each of which values a counter is assigned. Current is then extracted from the battery and the value of the respective end-of-discharge voltage at which the battery became discharged is determined. The counter reading for the counter assigned to the determined end-of-discharge-voltage value is then incremented. The above-mentioned method steps are repeated for each further discharging process. At a predetermined point in time, the counter reading of each counter is read off. A first factor representing a measure of the decline in maximum available battery capacity is determined as a function of the read-off counter readings. It should be noted that current extraction or discharging processes are not enforced especially for measurement purposes, but arise as a result of normal battery operation.

In an embodiment, because a plurality of end-of-discharge-voltage values are included, the diminution in the maximum available capacity of a battery can be determined more precisely as a function of the discharge depth of a discharging process.

As already mentioned above, the maximum available battery capacity needs to be accurately known in order to obtain the actual battery charge status.

One option for determining the first factor consists in establishing, for each battery type to be monitored, measurement series which exhibit the various end-of-discharge-voltage values as parameters and which are plotted over the number of discharging processes. In this case, a particular value, which indicates the extent to which the maximum available capacity has declined relative to the nominal capacity, is associated with each counter reading for an end-of-discharge-voltage value at the end of each current extraction.

In order to be able to indicate the battery quality, i.e. the value of the decline in maximum available battery capacity relative to the nominal capacity, even more precisely, the battery temperature is measured and the counter reading of the respective counter is incremented with temperature-weighting.

The degree of temperature-weighting can be read off for the respective battery type from various series of measurements that have been generated for various battery temperatures.

In an embodiment, the maximum available battery capacity can be determined even more accurately by measuring the battery temperature and the service life or duration of the battery. Determined then from the measured battery temperature and the measured service life or duration is a second factor, which is a further measure of the decline in maximum available battery capacity. It should be noted at this point that the measured service life of the battery allows conclusions to be drawn as to its durability.

In order to obtain even more precise information as to the maximum available battery capacity, the internal resistance of the battery is determined. A third factor, which represents a further measure of the decline in maximum available battery capacity, is determined as a function of the established internal resistance.

In order to determine the actual charge status of the battery, a charging-current and discharging-current balancing operation, or charge balancing for short, is performed. Charge balancing methods that are known per se may be used for this purpose. If, in addition, the actual discharging current is measured during battery operation, the anticipated battery operating time can be determined as a function of the actual charge status, the actual discharging current and the maximum available battery capacity. Owing to such measures, it is possible to continue operating the system, by means of the UPS devices used, for a specific period following a power failure, which may even correspond with the maximum operating time. In addition, it is thereby ensured that, on expiry of the maximum operating time, a sufficiently high battery power to safely close down the consumer units is still available.

For the charging- and discharging-current balancing operation, the characteristic values selected for the battery type to be monitored are used together with the measured actual battery current, the actual battery temperature and/or the actual battery voltage in order to determine therefrom the actual charge status.

The characteristic values of the battery may refer to the nominal voltage, the durability, the nominal capacity, the internal-resistance characteristic, the thermal behaviour and other parameters. These values are determined in advance with the aid of numerous series of measurements, and are taken into consideration when implementing the method.

In an embodiment, an apparatus for monitoring the maximum available capacity of a battery is provided. The apparatus is equipped with a memory device in which a plurality of diverse ranges for end-of-discharge-voltage values are made-up. The apparatus is further equipped with a plurality of counters, which are respectively assigned to one of the ranges of the end-of-discharge-voltage values. A control and analysis device is designed to determine the range of the end-of-discharge-voltage value at which the battery has become discharged at the end of each current extraction to control the incrementation of the counter reading of the counter assigned to the currently determined end-of-discharge-voltage value, to read off the counter reading from each counter and to determine, as a function of the read-off counter readings, a first factor, which represents a measure of the decline in maximum available battery capacity.

In an embodiment, in order to be able to provide more precise information as to the decline in maximum available battery capacity, a temperature detector to measure the actual battery temperature and a device to measure the service life of the battery are provided. The control and analysis device is designed in a manner such that it can determine from the measured battery temperature and the measured service life a second factor, which represents a further measure of the decline in maximum available battery capacity.

The control and analysis device is also capable of determining the internal resistance of the battery in order to define a third factor as a function of the determined internal resistance, which third factor represents a further measure of the decline in maximum available battery capacity.

In order to be able to provide precise information as to the actual available maximum battery capacity, the control and analysis device can determine the maximum available battery capacity as a function of the first and second and/or third factors.

In order to determine the actual charge status of the battery, the apparatus is equipped with a further memory device to store the characteristic values of the battery, a voltage detector to detect the actual battery voltage, and a current detector to detect the actual battery current. The control and analysis device is furthermore designed to execute a charge balancing operation.

The apparatus according to the invention for monitoring the maximum available capacity of a battery is integrated into a mains for uninterrupted power supply of a consumer unit.

It should be noted that the items of information used to define the actual capacity of the battery can be determined during operation of the UPS device. In other words, the battery is in this case permanently connected to the UPS device.

Figure 2:
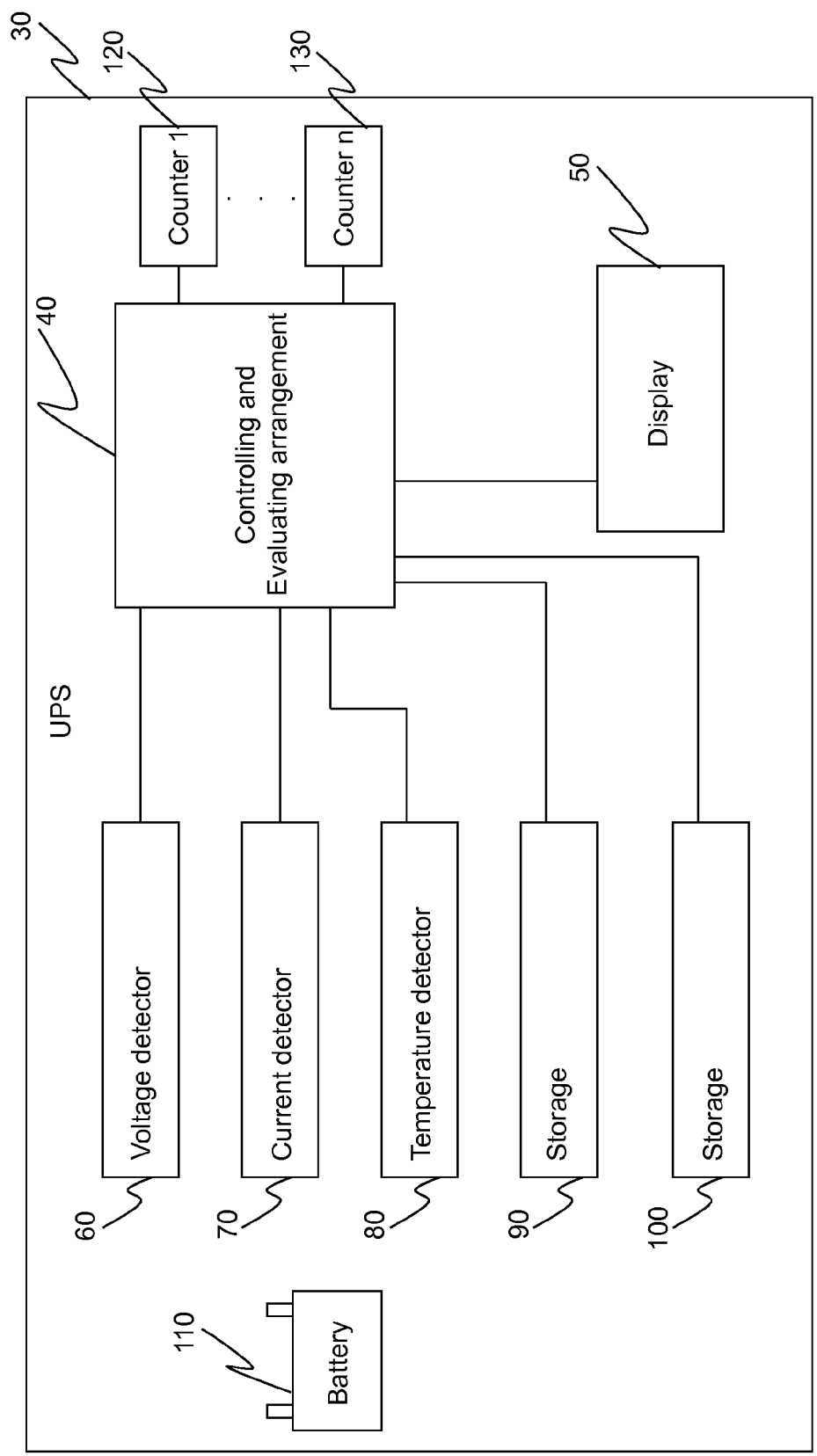
FIG. 2 shows an embodiment of the invention providing an uninterruptible power supply.

FIG. 2 shows an example of a UPS device 30, i.e. an uninterruptible power supply, which contains a rechargeable battery 110. By means of the UPS device 30, electrical appliances or systems can, in the event of a power failure, continue to be supplied with power on a temporary basis and then safely closed down. To monitor the battery 110, the UPS device 30 is equipped with a plurality of sensors or detectors, such as a voltage detector 60, a current detector 70 and a temperature detector 80. The voltage detector 60 measures the actual battery voltage at settable time points or continuously. The current detector 70 measures the actual battery current at settable time points or continuously. Depending on battery operation, the battery current will correspond with the discharging current or charging current. The temperature detector 80 measures the battery temperature at settable time points or continuously. The measured values from detectors 60, 70 and 80 are supplied to a control and analysis device 40. A memory 90 is provided in which a plurality of diverse ranges of end-of-discharge-voltage values, taken at the end of each current extraction, are made up. As described in greater detail below, the ranges of the end-of-discharge-voltage values serve for determination of the discharge depth of the battery 110 in relation to each discharging process.

Further provided is a memory 100, in which the characteristic values of the battery 110 are stored, e.g. during the initialisation phase. It should be noted that the characteristic values of the battery stored in the memory 100 have been determined in advance by means of a series of measurement cycles on a battery type that corresponds with battery 110. The contents of memories 90 and 100 can be read by the control and analysis device 40. The results determined by the control and analysis device 40 can be visually output via a display device 50. Further connected to the control and analysis device are a plurality of counters 120, 130, which are assigned respectively to one of the ranges of the end-of-discharge-voltage values made up in memory 90. This assignment is known to the control and analysis device.

The charge balancing and monitoring of the battery quality performed by the control and analysis device 40 is explained in greater detail below by reference to the flowchart shown in FIGS. 1A and 1B. The charge-balancing algorithm represented by way of example in the flowchart can be executed by the control and analysis device 40.

Let us firstly assume that the charge balancing with regard to battery 110 is to be undertaken for the first time. At the start of balancing, represented in FIG. 1A by the step 'Initialisation', the control and analysis device 40 is firstly initialised. To this end, all characteristic values of the battery are input and stored in the memory 100. If, on initial startup, the charge status of the battery 110 is unknown, the actual charge of the battery 110 is set at 25% in step 1. It is ensured in this manner that an immediate battery operation of the UPS device 30 is possible. Furthermore, the battery capacity, which below means the maximum available battery capacity, is set at the equivalent of the nominal capacity. At step 2, measurement begins of the battery current, battery voltage and battery temperature by the current detector 70, the voltage detector 60 and the temperature detector 80 respectively. The actual measured values are supplied to the control and analysis device 40 by the detectors 60 to 80. As shown in step 3 of the flowchart, the control and analysis device 40 determines correction values for the actual charge, which was set at 25% at the start, from the battery characteristic values stored in the memory 100 and from the actual measured values supplied by the detectors 60 to 80. The control and analysis device 40 can use appropriate characteristic values stored in the UPS device 30 for determination of the correction values. The correction values and measured values are updated in each charge-balancing cycle.

Let us now assume that the control and analysis device 40 has established at step 4 that the balancing cycle currently relates to a charging operation, so the UPS device is being mains operated. In this operating mode, the battery 110 is charged up via the mains voltage. The battery current measured at step 2 thus corresponds to the actual charging current of the battery. Consequently, the control and analysis device 40 recognises at step 5 that a charging current is flowing and the balancing algorithm branches off to step 6. Taking account of the values measured at step 2 and the correction values determined at step 3, the amount of additional charge the battery has received at this time is calculated within the actual balancing cycle. The actual charge, which had previously been set at 25%, is incremented by this value. The balancing algorithm then continues to step 7 and the control and analysis device 40 checks whether the actual battery charge has reached 100%. To this end, the control and analysis device 40 checks whether the battery-charging current measured at step 2 has fallen below a specific threshold value. In the present example, the control and analysis device 40 recognises at step 7 that the battery is not yet fully charged, and the charging operation is continued. As a consequence, the balancing algorithm jumps back to step 2.

Again, the actual measured values from detectors 60, 70 and 80 are input by the control and analysis device. At step 3, the correction factor for the actual charge is again determined, depending on the actual measured values and the characteristic values of the battery.

Let us assume that the charging current measured by the current detector 70 has still not fallen below the predetermined threshold value, so that, at steps 4 and 5, the control and analysis device 40 answers the queries respectively with 'yes'. Consequently, the amount of charge by which the battery charge is to be increased will again be measured at step 6, using the measured values measured by the detectors 60 to 80 and the correction values determined at step 3.

At step 7, the control and analysis device 40 now recognises that the battery is fully charged. The balancing algorithm therefore branches off to step 8. At step 8, the control and analysis device 40 terminates the charging operation. Since the charging current measured by the current detector 70 has fallen below the defined threshold, the control and analysis device 40 answers the query at step 5 with 'no'. Consequently, the control and analysis device 40 terminates the charging operation. Conversely, the mains operation at step 4 continues. The actual charge status continues to be monitored by means of the balancing algorithm.

Let us now assume that due to a mains breakdown, the mains operation is terminated at step 4. The UPS device 30 is to be operated in current extraction or discharging mode from the battery. The voltage detector 60 again determines the actual battery voltage, the current detector 70 determines the actual battery current, and the temperature detector 80 determines the actual battery temperature. The battery current measured by the current detector 70 now corresponds with the actual or currently measured discharging current. At step 3, as described above, correction factors are determined in the control and analysis device 40 using the actual measured values and the characteristic values. The balancing algorithm now branches off from step 4 to step 9. The correction values are used together with the actual measured values at step 9 for calculation of the amount of charge that the battery has lost in the actual balancing cycle. The actual charge of battery 110 is decremented by this value.

It should be noted at this point that, according to the Peukert effect, the discharging current measured by current detector 70 in battery operation determines the maximum withdrawable charge from battery 110. The control and analysis device 40 is designed to provide, as a function of the currently determined charge status of the battery and the currently measured discharging current, a prediction as to the battery operating time in battery operation or discharging mode. The relevant value can be shown on the display 50.

At step 10, the control and analysis device 40 checks whether the currently calculated charge is greater than the provided remaining charge for shutting down the consumer unit, symbolized with ">0%" in FIG. 1A. If so, the balancing algorithm branches off to step 11.

At step 11, the control and analysis device 40 checks whether the actual battery voltage has fallen to the lowest end-of-discharge voltage. If so, the battery is assumed to be charged with the provided remaining charge, and the consumer unit is shut down. This also takes place, if the provided remaining charge is reached in step 10. If, however, the voltage has not fallen below the lowest end-of-discharge voltage, the battery 110 can continue being discharged, and the balancing algorithm jumps to step 2. The UPS device 30 can consequently operate in discharging operation as before. If, however, the control and analysis device 40 finds at step 11 that the actual battery voltage measured by the voltage detector 60 is smaller than the lowest end-of-discharge voltage, the discharging process is terminated in so far as only the consumer unit is shut down. The control and analysis device 40 can output on the display device 50 the relevant information that the UPS 30 is no longer operationally ready.

Thus, the control and analysis device 40 is designed in a manner such that, as a function of the currently determined battery charge, it initiates the shutdown of a consumer unit connected to the UPS device 30 in sufficiently good time for it to be safely closed down. Only after the shutdown should the actual battery voltage fall below the end-of-discharge voltage.

When mains operation begins again, the control and analysis device 40 ensures that the battery 110 is connected to the mains voltage supply and is charged.

In order to be able to determine the actual charge status of the battery 110, and to derive therefrom a prediction as to the actual battery operating time, the control and analysis device 40 can determine the battery quality. By contrast with charge balancing, which is advantageously undertaken cycle-by-cycle, the actual battery quality can be checked at longer, parameterisable intervals. The battery quality is defined by a value which indicates how great the maximum available battery capacity is relative to the nominal capacity. If, for example, the battery capacity falls below a value of 80%, the battery 110 is deemed to be non-useable. Information to this effect can be shown by the control and analysis device 40 via the display device 50.

The check of battery quality, or of maximum available battery capacity, starts at step 14 of the flowchart shown in FIG. 1B. At step 14, which may be optional, the control and analysis device 40 determines the service life of the battery. Measurement of the service life can take place permanently. Taking account of the currently measured battery temperature by the temperature detector 80, and the measured service life, a temperature-weighted factor representing a measure of the falling value of the maximum available battery capacity is determined. To this end, the control and analysis device 40 can have recourse to appropriate characteristic values that indicate a loss factor as a function of the service life of the battery, or its durability, and the currently measured battery temperature. The correction of the maximum available battery capacity is undertaken at step 15.

At step 16, the control and analysis device 40 permanently monitors the charge balancing as to when a current extraction from the battery, i.e. a discharging process has been terminated. If a discharging process has been terminated, the control and analysis device 40 determines the respective end-of-discharge voltage at which the battery 110 became discharged in the respective discharging process and assigns such discharge voltage into its range of discharge voltage values. To this end, the control and analysis device 40 is connected to an appropriate number of counters 120 to 130, each of which is assigned to one of the ranges of the end-of-discharge-voltage values made up in the memory 90. Every discharging process detected by the control and analysis device 40 is thus counted in the respective counter as a function of the respective end-of-discharge-voltage value detected. The control and analysis device 40 can have recourse to appropriate characteristic values, which provide an appropriate value for every counter value and for every end-of-discharge-voltage value in relation to the battery type used. As a function of the counter readings of counters 120, 130, the control and analysis device 40 then determines a factor which is again a measure of the decline in maximum available battery capacity. In addition, the control and analysis device 40 can also take account of the currently measured battery temperature during a discharging process in order to increment the counter reading of the respective counters 120 and 130 with temperature weighting.

The control and analysis device 40 can then determine, from the temperature-weighted counter readings, an even more precise value for the battery quality, or the maximum available battery capacity. The relevant calculation of the maximum available battery capacity is undertaken at steps 16 and 17.

A further measure of the decline in maximum available battery capacity can be determined from the dynamic internal resistance of the battery 110. Numerous methods of calculating the internal resistance of the battery are known.

In the present example, the dynamic internal resistance can be measured at step 18 as follows: firstly, let us assume that the dynamic internal resistance of the battery 110 is measured with a fully charged battery and with temperature compensation. According to a first measurement method, a small alternating voltage with constant frequency, e.g. 100 Hz, is imposed on the battery voltage and the battery alternating current is then measured by the current detector 70. The internal resistance can then be calculated by the control and analysis device 40 according to the equation $R_I = U_{EFF}/I_{EFF}$.

According to an alternative measurement method, two direct currents are successively withdrawn from the battery 110 and the relevant battery voltages are measured therefrom. The internal resistance is derived according to the equation $R_I = \Delta U/\Delta I$. In order to eliminate temperature influences on the internal resistance, the measured value of the internal resistance, together with the measured value for the actual battery temperature, is converted to a resistance value at a standardised temperature. These standardised resistance values are comparable one with another. In order to assess the measured internal resistance in respect of its influence on the maximum available battery capacity, it is necessary to measure and store a reference value in the brand new condition of battery 110. A measure of the declining battery capacity is now derived from the increase in internal resistance.

At step 19, the maximum available battery capacity is then corrected for the changes in internal resistance.

It should be noted at this point that the generation of the characteristic values necessary for calculating the correction factors for the battery capacity and for the actual charge status of the battery 110 are not part of the subject-matter of the invention and will therefore not be described in greater detail.

At the end of the battery quality check, the algorithm jumps to step 2 and the above-described charge-balancing process starts afresh.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

What is claimed is:

1. A method of monitoring a maximum available capacity of a battery comprising:
   a) providing a plurality of diverse end-of-discharge-voltage values;
   b) assigning a counter to each of the plurality of diverse end-of-discharge-voltage values;
   c) discharging the battery;
   d) determining one of the plurality of end-of-discharge-voltage values at which the battery is discharged;
   e) incrementing a counter reading of the counter assigned to the determined end-of-discharge-voltage value;
   f) repeating steps c-e;
   g) reading-off the counter readings so as to obtain a plurality of read-off counter readings; and
   h) determining, based on the plurality of read-off counter readings, a first factor representing a first measure of a decline in the maximum available battery capacity.

2. The method as recited in claim 1, further comprising measuring a temperature of the battery, wherein the incrementing step includes incrementing the counter reading with a temperature-weighting.

3. The method as recited in claim 1, further comprising measuring a temperature of the battery and a service life of the battery, and determining a second factor from the battery temperature and the service life representing a second measure of the decline in the maximum available battery capacity.

4. The method as recited in claim 1, further comprising determining an internal resistance of the battery, and determining a third factor from the internal resistance of the battery representing a third measure of the decline in the maximum available battery capacity.

5. The method as recited in claim 4, further comprising:
   performing a charging-current and discharging-current balancing operation so as to determine an actual charge status of the battery;
   measuring an actual discharge status during operation of the battery; and
   determining an anticipated battery operating time based on the actual charge status, the actual discharge status and the maximum available batter capacity.

6. The method as recited in claim 5, further comprising storing characteristic values of the battery before the performing the charging-current and discharging-current balancing operation.

7. The method as recited in claim 6, wherein at least one of an actual battery current, an actual battery temperature and an actual battery voltage are measured during the charging-current and discharging-current balancing operation.

8. The method as recited in claim 7, wherein the actual charge status is determined based on at least one of the characteristic values of the battery, the actual battery current, the actual battery temperature and the actual battery voltage.

9. An apparatus for monitoring the maximum available capacity of a battery, the apparatus comprising:
   a control and analysis device;
   a voltage device configured to determine an end-of-discharge voltage at an end of each of a respective current extraction from the battery;
   a first memory configured to store a plurality of ranges for values of battery charges at the respective determined end-of-discharge voltages;
   a plurality of counters each assigned to one of the ranges for values of the battery charges at respective end-of-discharge voltages, and for counting respective occurrences of an end-of-discharge voltage in the respective assigned range of values;
   a second memory configured to store battery characteristic values; and
   a first factor determining device configured to determine a first factor based on the respective counted occurrences in the respective ranges of battery charge values and of the battery characteristic values, wherein the first factor represents a first measure of a decline in maximum available battery capacity.

10. The apparatus as recited in claim 9, further comprising:
    a temperature detector for measuring the actual battery temperature;
    a measuring device configured to measure a service life of the battery; and
    a second factor determining device configured to determine a second factor based on the measured battery temperature and on the measured service life, the second factor representing a second measure for the decline in maximum available battery capacity.

11. The apparatus as recited in claim 9, further comprising:
    a resistance determining device configured to determine an internal resistance of the battery; and
    a third factor determining device configured to determine a third factor based on the determined internal resistance, the third factor representing a third measure for the decline in maximum available battery capacity.

12. The apparatus as recited in claim 10, wherein the control and analysis device is configured to process at least one of the first, the second and the third factor so as to determine the maximum available battery capacity.

13. The apparatus according to claim 9, further comprising a voltage detector configured to detect a respective actual battery voltage and a current detector configured to detect a respective actual battery current, wherein the second memory is configured to assign the characteristic values of the battery to the counted occurrences of the counters, and wherein the control and analysis device is configured to:
- perform a charging-current and discharging-current balancing operation so as to determine an actual charge status of the battery;
- measure an actual discharge status during operation of the battery; and
- determine an anticipated battery operating time based on the actual charge status, the actual discharge status and the maximum available batter capacity.

14. An uninterruptible power supply including the apparatus as recited in claim 9.

\* \* \* \* \*